United States Patent [19]
Mariani et al.

[11] Patent Number: 5,162,691
[45] Date of Patent: Nov. 10, 1992

[54] CANTILEVERED AIR-GAP TYPE THIN FILM PIEZOELECTRIC RESONATOR

[75] Inventors: Elio A. Mariani, Hamilton Square; Raymond McGowan, Neptune, both of N.J.

[73] Assignee: The United States of America as represented by the Secretary of the Army, Washington, D.C.

[21] Appl. No.: 643,634

[22] Filed: Jan. 22, 1991

[51] Int. Cl.$^5$ ............................................ H01L 41/08
[52] U.S. Cl. .................................. 310/321; 310/324; 310/330; 310/331
[58] Field of Search ................ 310/311, 324, 330–332, 310/321, 323

[56] References Cited

U.S. PATENT DOCUMENTS

| | | | |
|---|---|---|---|
| 3,486,046 | 12/1969 | Zalar | 310/324 |
| 3,513,356 | 5/1970 | Newell | 310/321 X |
| 3,879,992 | 4/1975 | Bartera | 310/321 X |
| 4,456,850 | 6/1984 | Inoue et al. | 310/324 |
| 4,517,486 | 5/1985 | Andrews | 310/331 |
| 4,642,508 | 2/1987 | Suzuki et al. | 310/324 X |
| 4,734,609 | 3/1988 | Jasmine | 310/312 X |
| 4,764,244 | 8/1988 | Chitty et al. | 310/321 X |
| 4,906,840 | 3/1990 | Zdeblick et al. | 310/328 X |
| 5,034,645 | 7/1991 | Woodruff et al. | 310/330 X |
| 5,049,775 | 9/1991 | Smits | 310/331 X |
| 5,075,641 | 12/1991 | Weber et al. | 310/324 X |

FOREIGN PATENT DOCUMENTS 0153412   9/1983   Japan .................................. 310/324

OTHER PUBLICATIONS

VHF/UHF Composite Resonator on a Silicon Substrate, by Kitayama et al, Jap. Jour. of App. Physics, Supplement 22-3, vol. 22, 1983, pp. 139–141.

"An Air-Gap Type Piezoelectric Composite Thin Film Resonator", Satoh et al, IEEE Proceedings, 39th Annual Symposium on Frequency Control 1985, pp. 361–366.

"Stacked Crystal Filters Implemented With Thin Films", Lakin et al, IEEE Proceedings 43rd Annual Symposium on Frequency Control, 1989, pp. 536–543.

*Primary Examiner*—Mark O. Budd
*Attorney, Agent, or Firm*—Michael Zelenka; William H. Anderson; Raymond M. Saunders

[57] ABSTRACT

A method and apparatus directed to a thin film piezoelectric resonator deposited on a support layer of dielectric material and being configured in the form of a cantilever structure having a base portion formed on an integrated circuit substrate and having an overhanging beam portion joined at one end to the base portion, with the opposite end being unsupported with an air-gap intermediate the beam portion and the substrate. In the fabrication of the resonator, a thin film of dielectric material, e.g. zinc oxide (ZnO) is first deposited on the substrate, but is subsequently removed from beneath the beam portion resulting in the air-gap which is open on three sides and thus results in a greater ease of fabrication. A completely monolithic chemical detector is implemented utilizing a matched pair of these cantilevered air-gap thin film resonators, with one of the resonators further including a coating on one of its electrodes and which is responsive to a predetermined chemical to cause a frequency shift in the presence of the chemical to be detected. In one embodiment of the chemical detector, the frequency outputs of the two resonators are compared with the difference frequency providing an indication of the chemical being detected.

7 Claims, 2 Drawing Sheets

5,162,691

CANTILEVERED AIR-GAP TYPE THIN FILM PIEZOELECTRIC RESONATOR

GOVERNMENT INTEREST

This invention was made by employees of the U.S. Government. Accordingly, this invention may be used by or for the Government for governmental purposes without the payment of any royalties thereon or therefor.

FIELD OF THE INVENTION

This invention relates generally to analog signal processing and piezoelectric thin film resonators and more particularly to a cantilevered air-gap type thin film piezoelectric resonator and a chemical detector implemented with such resonators.

BACKGROUND OF THE INVENTION

Thin film resonators having a diaphragm consisting of a piezoelectric zinc oxide film on a silicon or silicon dioxide film are generally known and have received considerable attention due to the fact that such devices exhibit a low temperature coefficient at the resonant frequency which is determined by the thickness of the piezoelectric film. Resonant frequencies in the VHF/UHF frequency range have been developed and have received considerable attention inasmuch as these devices are compatible with integrated circuit structures in their fabrication processes and device size. Further, a self-supported thin film resonator with a very thin air-gap between the semiconductor surface and the diaphragm bottom surface has been developed and is disclosed, for example, in a publication entitled "Air-Gap Type Piezoelectric Composite Thin Film Resonator", H. Satoh et al, *Proceedings of the 39th Annual Symposium On Frequency Control*, 1985, pp. 361-366. While such resonators are presumed to operate as intended, certain inherent limitations nevertheless exist, particularly as it relates to their fabrication.

It is an object of the present invention, therefore, to provide an improvement in piezoelectric resonators.

It is a further object of the invention to provide an improvement in thin film piezoelectric resonators.

It is still another object of the invention to provide an improvement in air-gap type piezoelectric thin film resonators and their relative ease of fabrication so as to provide a higher device and circuit yield.

It is still yet another object of the invention to apply an improvement in air-gap type thin film resonators having a cantilever construction to implement a monolithic chemical sensor.

SUMMARY OF THE INVENTION

Briefly, the foregoing and other objects are achieved by a method and apparatus for providing a thin film piezoelectric resonator deposited on a support layer of dielectric material in the form of a cantilever structure having a base portion formed on a substrate for integrated circuits and an overhanging beam portion joined at one end to the base portion, with the opposite end being unsupported with an air-gap intermediate the beam portion and the substrate. In the fabrication of the resonator, a thin film of dielectric material is first deposited on the substrate, but is subsequently removed from beneath the beam portion to provide the air-gap which is open on three sides and thus results in a greater ease of fabrication. A completely monolithic chemical detector is implemented utilizing a matched pair of these cantilevered air-gap thin film resonators, with one of the resonators further including a coating on one of its electrodes and which is responsive to a predetermined chemical to cause a frequency shift in the presence of the chemical to be detected. In one embodiment of a chemical detector, the frequency outputs of the two resonators are compared with the difference frequency providing an indication of the chemical being detected

BRIEF DESCRIPTION OF THE DRAWINGS

The following detailed description of the invention will become more readily understood when considered together with the accompanying drawings wherein.

DETAILED DESCRIPTION OF THE INVENTION

Figure 1:
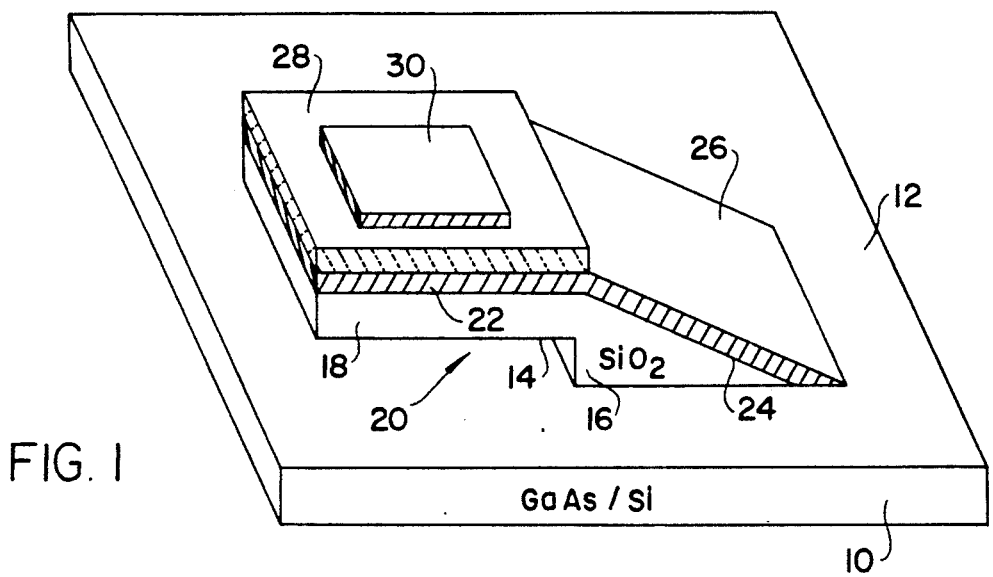
FIG. 1 is a perspective view generally illustrative of the preferred embodiment of the cantilevered air-gap type thin film piezoelectric resonator in accordance with the invention.

Referring now to the drawings and more particularly to FIG. 1, shown thereat is an embodiment of a cantilevered air-gap type thin film piezoelectric resonator. As shown, reference numeral 10 denotes a substrate used for integrated circuits and is shown comprising gallium arsenide (GaAs) or silicon (Si). On the upper surface 12 of the substrate, there is formed a cantilever support structure 14 comprised of insulator material such as silicon dioxide ($SiO_2$). The cantilevered support structure 14 is comprised of a base portion 16 from which there extends a beam portion 18 under which there is an air-gap 20 which is open on three sides. The beam portion 18 is shown having a generally uniform thickness extending parallel over the top surface 12 of the substrate 10 and defines a generally rectangular surface area on the top surface 22. The base portion 16, on the other hand, is generally triangular in shape, having a sloping or an inclined upper surface 24. Over the top of the base portion including the top surface portion 22 and 24, there is formed a first or bottom metallic electrode 26. On top of the metallic electrode 26 over the top surface portion 22 of the beam portion 18 there is formed a thin film 28 of polycrystalline piezoelectric material such as aluminum nitride (AlN) or zinc oxide (ZnO). On top of the piezoelectric thin film layer 28 there is formed a second or top metallic electrode element 30.

Both the piezoelectric film 28 and the top electrode 30 are illustrated as being of a generally square configuration with the top electrode 30 being relatively smaller in size than the piezoelectric film 28. However, the relative size and shape of these two elements is selectively chosen by the designer for the particular application.

Upon the application of an excitation voltage across the electrodes 26 and 30, a compressional wave is generated in the piezoelectric material 28, with the thickness of the piezoelectric film 28 determining the frequency of operation in the fundamental mode. The thickness of the thin piezoelectric film 28 represents a half wavelength at the fundamental frequency. Operation of the device can occur at higher frequencies, however, by operating at high overtones.

Figure 2A:
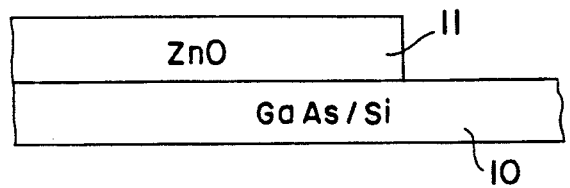
FIGS. 2A-2F are a set of central cross sectional views illustrative of the process by which the resonator shown in FIG. 1 is fabricated.
Figure 2B:
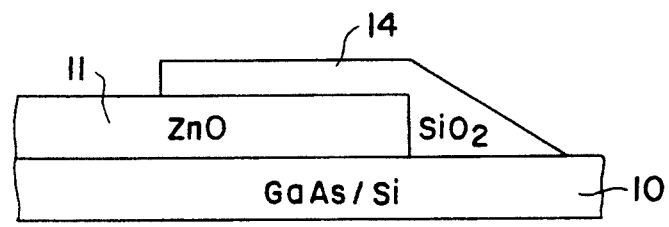
Figure 2C:
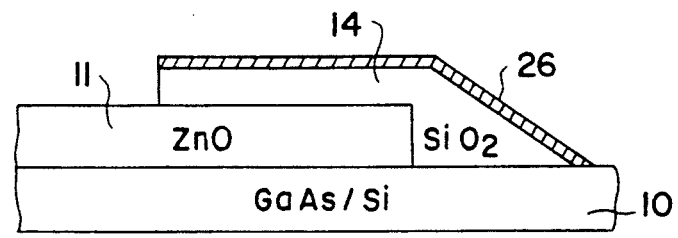
Figure 2D:
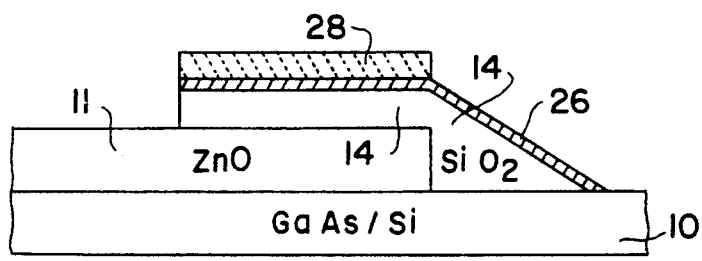
Figure 2E:
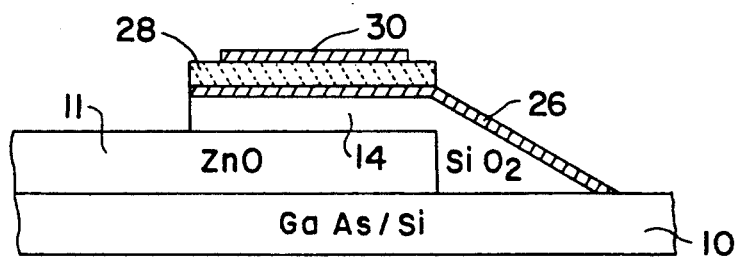
Figure 2F:
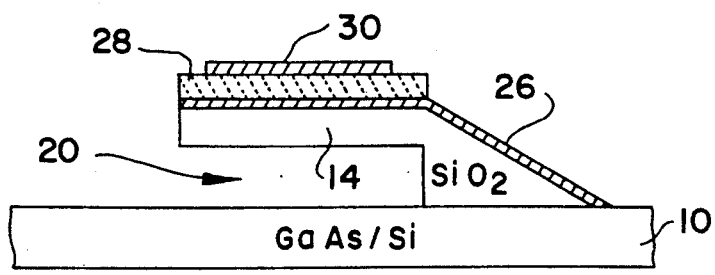

The resonator structure shown in FIG. 1 is fabricated in the manner shown in FIGS. 2A-2F. In the first step as shown in FIG. 2A, a thin film of dielectric material, such as non-piezoelectric ZnO, is deposited on the substrate 10 as shown by reference numeral 11. The thickness of the ZnO film 11 defines the height of the air-gap 20 shown in FIGS. 1 and 3. Next a layer of SiO$_2$ is deposited, as shown in FIG. 2B, which as noted above serves as a structural support for the thin film resonator. Next the layer of metallic electrode 26 forming the bottom electrode is deposited on the top surfaces 22 and 24 of the support structure 14. This is followed by a deposition of the piezoelectric film 28 as shown in FIG. 2D and which is then followed by the deposition of the second or upper electrode layer 30, as shown in FIG. 2E. Finally, the original supporting ZnO layer 11 is etched away using standard wet chemistry techniques upon completion of the device to form the air-gap 20 as shown in FIG. 2F.

The major advantage of the air-gap type thin film resonator resulting from fabrication steps shown in FIGS. 2A-2F, is that the cantilever construction permits faster, more reliable fabrication of the air-gap structure which is vital to the operation of this type of device. The geometry permits three sides of the support structure 14 to be accessible to etching and permits for an accelerated etching process, since the etching recedes from three sides instead of two as in the known prior art devices, thereby decreasing the possibility of damage to any other active components formed on the same integrated circuit substrate 10. Also the formation of a cleaner, well defined air-gap 20 provides for the ability to etch smaller gaps which add to the structural integrity and reliability of the resonator device.

Figure 3:
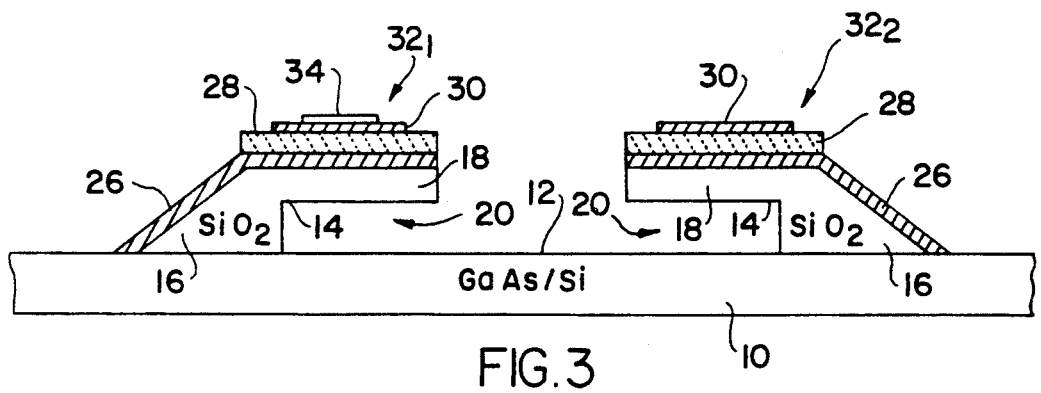
FIG. 3 is a cross sectional view illustrative of a pair of matched resonators fabricated on a common substrate.

Although a single resonator device is shown in FIG. 1, clusters of matched devices can be produced around and over a single air-gap support layer 11 of ZnO which when removed, results in air-gaps 20 being provided Such a configuration is shown in FIG. 3 where two resonator devices 32$_1$ and 32$_2$ are depicted. Clusters of these resonant structures can be used to form, for example, multi-resonator filters or multiple frequency sources operating singly or in combination.

This now leads to consideration of a practical application of the cantilevered resonator device shown in FIG. 1 and comprises the implementation of a chemical detector which, for example, utilizes the pair of matched resonators 32$_1$ and 32$_2$ as shown in FIG. 3. One of the resonators 32$_1$, however, includes an additional element in the form of a top most layer 34 which comprises a chemical coating selectively chosen that it either adsorbs, absorbs or chemisorbs a chemical to be detected such that it will cause a frequency shift in the cantilevered resonant frequency via mass loading of the active surface area of the piezoelectric film 28 overlaying the beam portion 18 of the SiO$_2$ support structure 14.

The chemical detector device operates on the same basic principle as other bulk acoustic wave devices in that the thickness of the piezoelectric film 28 determines the frequency of operation in the fundamental mode such that the film thickness represents a half wave at the fundamental frequency as referred to earlier. For a bulk wave device, the following relationship can be shown for relating a change in detector operating frequency for a change in the mass of the film coating the detector:

$$\frac{\Delta f}{\Delta M_s} = -\frac{2f^2}{Agv}$$

where $M_s$ is the mass of the film coating the detector surface, f is the operating frequency of the device, A is the surface area of the piezoelectric material, g is the density of the piezoelectric film, and v is the velocity of propagation of a transverse wave in the crystal plane. Therefore, any change in the mass loading caused by the detector coating 34 interaction with the desired contaminant will cause a corresponding change in the operating frequency. It can be shown that such a detector as described has a sensitivity of parts per billion. From equation (1) the increased sensitivity of the cantilevered chemical detector is apparent. The reduced active surface area A of the device will increase the frequency shift for any given mass of sorbed material, thereby increasing its sensitivity. Also, the ability to operate at higher frequencies also increases the sensitivity.

Figure 4:
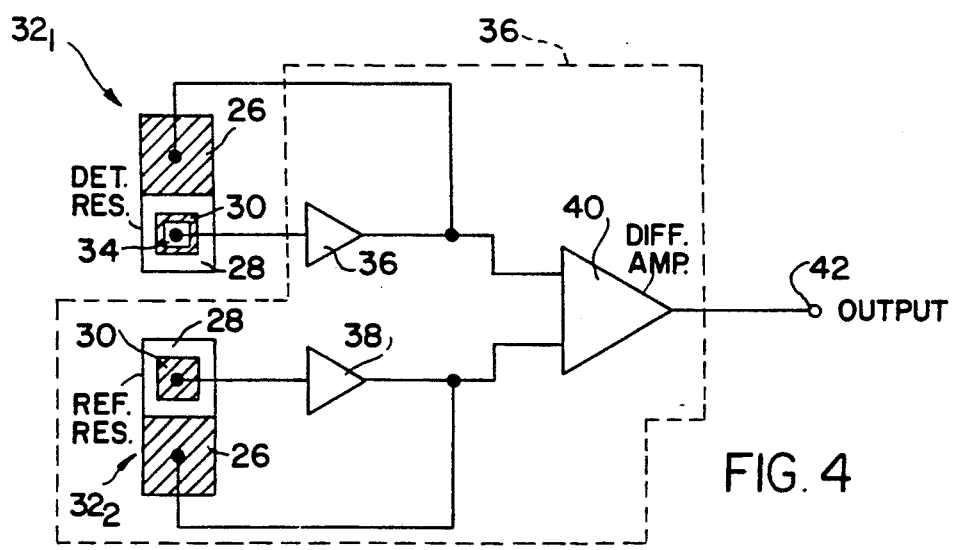
FIG. 4 is an electrical schematic of a chemical detector implemented by use of the matched pair of resonators shown in FIG. 3.

Referring now to FIG. 4, there is shown a schematic diagram of a monolithic chemical detector comprised of the matched pair 32$_1$ and 32$_2$ of cantilevered air-gap type thin film resonators which form the sensor circuit and where one of the resonators 32$_2$ serves as a reference frequency source while the other resonator 32$_1$ acts as the chemical detector The reference frequency source 32$_2$ is hermetically sealed in packaging 36 with the remainder of the active components including but not limited to, for example, a pair of RF amplifiers 36 and 38 which have their respective outputs coupled to a differential output amplifier 40. The detector resonator 32$_1$ includes a film 34 which remains exposed to the chemical(s) to be detected.

As shown, the output from the two resonator structures 32$_1$ and 32$_2$ feed into respective RF amplifiers 36 and 38 with a portion of their respective outputs being fed back as feedback to the electrodes 26 while the other part of the signal serves as the data signal. The two data signals from the resonators 32$_1$ and 32$_2$ are fed to the differential amplifier 40 which provides a difference frequency output which is representative of the difference in mass loading between the two resonators 32$_1$ and 32$_2$ and which provides an output signal at circuit terminal 42 which acts as the detector output for the chemical sensor.

Thus what has been shown and described is an improved piezoelectric thin film resonator which provides the basis for monolithic integration of very small filters and frequency sources which are required for highly compact RF/microwave integrated circuits.

Having thus shown and described what is at present considered to be the preferred embodiments of the invention, it should be noted that the same has been made by way of illustration and not limitation. Accordingly, all modifications, alterations and changes coming within the spirit and scope of the invention are herein meant to be included.

What is claimed is:

1. An air gap type piezoelectric resonator, comprising:

a substrate;

a support layer of dielectric material in the form of a cantilever structure including a base portion formed on said substrate and an overhanging beam portion joined at one end to said base portion with the opposite end of said beam portion being unsupported;

an air gap between said beam portion and said substrate;

a first electrode formed on a top surface of said support layer, and covering at least a portion of said beam portion;

a thin film of piezoelectric resonator material on said first electrode at said beam portion; and a second electrode on a top surface of said thin film of piezoelectric material, whereby upon being excited, a compressional wave will be generated across said electrodes having a fundamental frequency which is a function of the thickness of said thin film of piezoelectric material.

2. The resonator as defined by claim 1 wherein said support layer includes an inclined outer surface on said base portion.

3. The resonator as defined by claim 2 wherein said first electrode comprises a metallic electrode on the inclined outer surface of said base portion.

4. The resonator as defined by claim 1 wherein said substrate comprises a semiconductor substrate selected from the semiconductor materials including silicon (Si) and gallium arsenide (GaAs).

5. The resonator as defined by claim 4 wherein said thin film of dielectric material is comprised of non-piezoelectric zinc oxide (ZnO).

6. The resonator as defined by claim 5 wherein said thin film of piezoelectric material is comprised of polycrystalline piezoelectric material for supporting a compressional wave.

7. The resonator of claim 6 wherein said polycrystalline piezoelectric material is selected from the materials including zinc oxide (ZnO) and aluminum nitride (AlN).

* * * * *